United States Patent
Wu

(10) Patent No.: US 7,145,809 B1
(45) Date of Patent: Dec. 5, 2006

(54) METHOD FOR PROGRAMMING MULTI-LEVEL CELL

(75) Inventor: Chao-I Wu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/172,694

(22) Filed: Jul. 1, 2005

(51) Int. Cl.
*G11C 16/04* (2006.01)
(52) U.S. Cl. .............................. 365/185.28; 365/185.03
(58) Field of Classification Search ............ 365/185.28
See application file for complete search history.

(56) References Cited

U.S. PATENT DOCUMENTS

| | | | |
|---|---|---|---|
| 6,219,276 B1 | 4/2001 | Parker | 365/185.03 |
| 6,292,394 B1 | 9/2001 | Cohen et al. | 365/185.19 |
| 2001/0004325 A1* | 6/2001 | Choi | 365/185.14 |
| 2005/0286312 A1* | 12/2005 | Wu et al. | 365/185.29 |
| 2006/0140000 A1* | 6/2006 | Liao et al. | 365/185.17 |
| 2006/0146603 A1* | 7/2006 | Kuo et al. | 365/177 |
| 2006/0146613 A1* | 7/2006 | Lee et al. | 365/185.24 |

OTHER PUBLICATIONS

"Phines: A Novel Low Power Program/Erase, Small Pitch, 2-Bit per Cell Flash Memory" By Author C.C. Yeh et al. / 2002 IEEE / p. 931-934.

* cited by examiner

*Primary Examiner*—Son L. Mai
(74) *Attorney, Agent, or Firm*—J.C. Patents

(57) ABSTRACT

A method for programming a multi-level cell (MLC) is disclosed. First, a memory cell with a first storage position and a second storage position is provided. An erasing step is performed to increase the threshold voltages of the storage positions. Then, a judging step is preformed to compare the first programming state and the second programming state, which are going to be programmed for the first storage position and the second storage position, to select a proper programming step.

16 Claims, 15 Drawing Sheets

METHOD FOR PROGRAMMING MULTI-LEVEL CELL

BACKGROUND OF THE INVENTION

1. Field of the Invention

The present invention relates to an operational method for a memory, and more particularly, to a method for programming a multi-level cell (MLC).

2. Description of the Related Art

According to whether data stored in memory devices can be maintained after power is removed, memory devices are categorized into volatile memory and non-volatile memory. Wherein, non-volatile memories can be programmed and erased, and maintain stored data even if power is cut off. Because of these advantages, non-volatile memories have been widely applied in personal computers and electronic equipment.

Generally, a non-volatile memory is composed of many memory cells. Each memory cell is composed of a bottom dielectric layer (tunnel layer), a charge storage layer, a top dielectric layer (charge barrier layer) and a control gate layer which are sequentially formed on a substrate. Moreover, a non-volatile memory cell can store one or more bits in accordance with different materials of the charge storage layer used. For example, if the material of the charge storage layer is a conductive material, a memory cell stores one bit. If the material of the charge storage material is a non-conductive material, two sides of the charge storage layer can be served as two storage positions. Thus, the memory cell stores two bits.

Due to huge computer software programs being applied, capacity of memory should also be increased. The prior-art memory which is adapted to store one or two bits cannot satisfy the requirement described above. Moreover, the requirement for device integrity is increased. Accordingly, how to increase capacity of memory without affecting device integrity becomes an essential topic in this field.

SUMMARY OF THE INVENTION

Accordingly, the present invention is directed to a method for programming a multi-level cell. Without affecting the device integrity, the single memory cell serves as a multi-level cell.

The present invention provides a method for programming a multi-level cell. According to the method, a memory cell is provided. The memory cell comprises a first storage position and a second storage position, wherein each of the first storage position and the second storage position stores n bits, and $2^n$ states with different threshold voltages. The threshold voltages of the states are gradually reduced from the first state to the $2^n$th state. The memory cell is erased to raise and make threshold voltages of the first and second storage positions larger than the threshold voltages of the statuses. Then, a judging step is performed to compare a first programming state and a second programming state, which are going to be programmed for the first storage position and the second storage position, respectively. When the first programming state is as same as the second programming state, a two-side programming step is performed to the memory cell; when one of the first programming state and the second programming state is the first state, and another is a state except the first state, a one-side programming step is performed to the memory cell; and when the first programming state and the second programming state are not the first state, and the threshold voltages corresponding to the first programming state and the second programming state are different, a switched two-side programming step is performed to the memory cell.

According to the method for programming the multi-level cell of a preferred embodiment of the present invention, the two-side programming step comprises: (a) programming one of the first storage position and the second storage position with a time interval sequence; and (b) programming another of the first storage position and the second storage position with the time interval sequence. In addition, after the step (b) the method further comprises: (c) performing a testing step to check whether the threshold voltages of the first storage position and the second storage position are equal to the threshold voltages corresponding to the first programming state and the second programming state; if not, the steps (a) and (b) are repeated at least once until the threshold voltages of the first storage position and the second storage position are equal to the threshold voltages corresponding to the first programming state and the second programming state.

According to the method for programming the multi-level cell of a preferred embodiment of the present invention, the one-side programming step comprises: (a) programming one of the first storage position and the second storage position, wherein the programming state corresponding to the programmed storage position is not the first state. In addition, after the step (a) the method further comprises: (b) performing a testing step to check whether the threshold voltage of the programmed storage position is equal to the threshold voltage corresponding to the programming state; if not, the step (a) is repeated at least once until the threshold voltage of the programmed storage position is equal to the threshold voltage corresponding to the programming state.

According to the method for programming the multi-level cell of a preferred embodiment of the present invention, the switched two-side programming step comprises: (a) comparing the threshold voltages of the first programming state and the second programming status; (b) selecting one of the first programming state and the second programming state, which has a lower threshold voltage, and performing a first-programming to the storage position corresponding thereto until a difference of the threshold voltages of the first storage position and the second storage position reaches a value; and (c) performing a second-programming to another storage position. In addition, after the step (b) and before the step (c), the method further comprises: (b1) performing a testing step to check whether the difference of the threshold voltages of the first storage position and the second storage position reaches the value; if not, the step (a) is repeated at least once until the difference of the threshold voltages of the first storage position and the second storage position reaches the value. Moreover, after the step (c) the method further comprises: (c1) performing a testing step to check whether the threshold voltage of the programmed storage position is equal to the threshold voltage corresponding to the programming state; if not, the step (c) is repeated at least once until the threshold voltage of the programmed storage position is equal to the threshold voltage corresponding to the programming state.

Since before the memory cell of the present invention is programmed, the programming state that is going to be programmed will be determined first. Accordingly, a desired programming step is selected to write data, and the distributions of the threshold voltages of different levels are effectively controlled. The single memory cell thus serves as a multi-level cell. Moreover, by using the desired programming step to write data, the memory cell has a better detecting window for the subsequent read operation of the memory cell. According to the method of the present invention, the issue caused by the second bit can be effectively controlled and the failure of the subsequent read operation of the memory cell is reduced.

The above and other features of the present invention will be better understood from the following detailed description of the preferred embodiments of the invention that is provided in communication with the accompanying drawings.

DESCRIPTION OF SOME EMBODIMENTS

The present invention provides a method for programming a multi-level cell. The method is adapted for a non-volatile memory cell with a charge storage layer that is non-conductive material. The non-volatile memory cell can be, for example, a read only memory cell with a silicon nitride layer. Additionally, the programming method of the present invention includes hole programming and electron erasing. In detail, according to the programming method of the present invention, electrons are injected into the charge storage layer to enhance the threshold voltages of the memory cells of the memory device. Wherein, since electrons are injected for the whole memory device, it can also be deemed as an electron erasing operation. After electron injection, a proper amount of holes are injected into the selected memory cell to lower the threshold voltage of the storage position. As a result, the programming function is achieved. The method including hole write and electron erasing is also called a PHINES operation.

Figure 1:
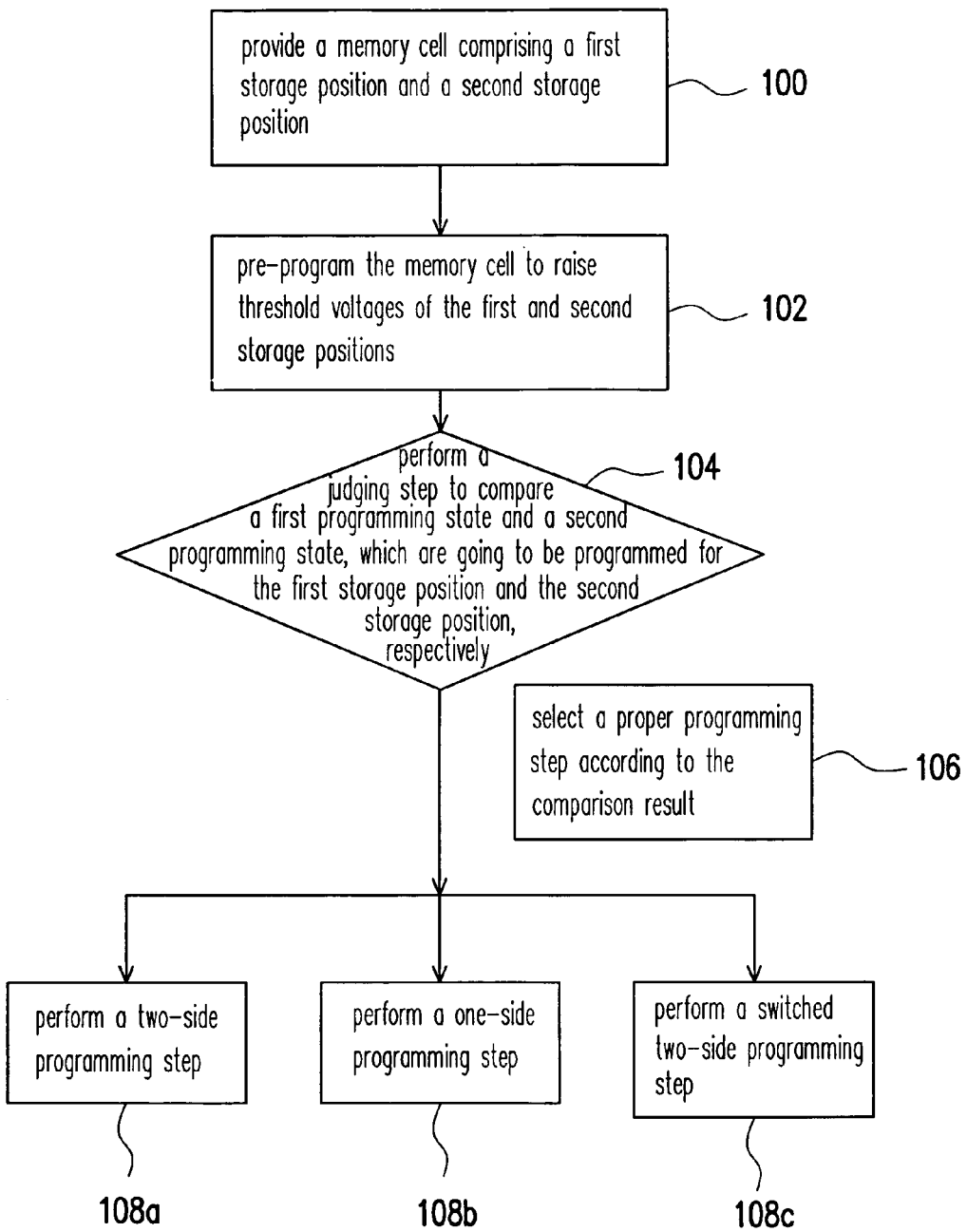
FIG. 1 is a flowchart showing a method of programming a multi-level cell according to a preferred embodiment of the present invention.

FIG. 1 is a flowchart showing a method of programming a multi-level cell according to a preferred embodiment of the present invention. According to the programming method of the present invention, a memory cell is provided. The memory cell comprises a first storage position and a second storage position (step 100). Wherein, each of the first storage position and the second storage position stores n bits, and $2^n$ states with different threshold voltages, and the threshold voltages of the states are gradually reduced from the first state, the second state . . . to the $2^n$th state. Note that the threshold voltages corresponding to the states are different. The differences between the threshold voltages of every two neighboring states can be same or different.

The memory cell is then erased to raise and make threshold voltages of the first and second storage positions larger than the threshold voltages of the states described above (step 102). In detail, electrons are injected into each memory cell of the memory device by the FN or −FN tunneling effect in the step 102. It means that all memory cells are programmed at the high threshold voltage state by similar erasing operation mechanisms.

Then, a judging step is performed to compare a first programming state and a second programming state, which are going to be programmed for the first storage position and the second storage position, respectively (step 104). Wherein, the first programming state and the second programming state are selected from the first state, the second state . . . to the $2^n$th state. Moreover, the states of the first programming state and the second programming state can be same or different.

According to the comparison result, a proper programming step is selected (step 106). In detail, step 106 injects holes into the selected memory cell. By injecting a proper amount of holes, the reductions of the threshold voltages of the first storage position and the second storage position are so different that the purpose of programming the memory cell is achieved. Wherein, the programming steps for selection are provided below. In step 108a, when the first programming state is as same as the second programming state, a two-side programming step is performed to the memory cell. In step 108b, when one of the first programming state and the second programming state is the first state, and another is a state except the first state, a one-side programming step is performed to the memory cell. In step 108c, when the first programming state and the second programming state are not the first state, and the threshold voltages corresponding to the first programming state and the second programming state are different, a switched two-side programming step is performed to the memory cell.

In the embodiment described below, n is 2. The following descriptions are merely an embodiment of the present invention. The present invention is not limited thereto. N can be other integers.

Figure 2:
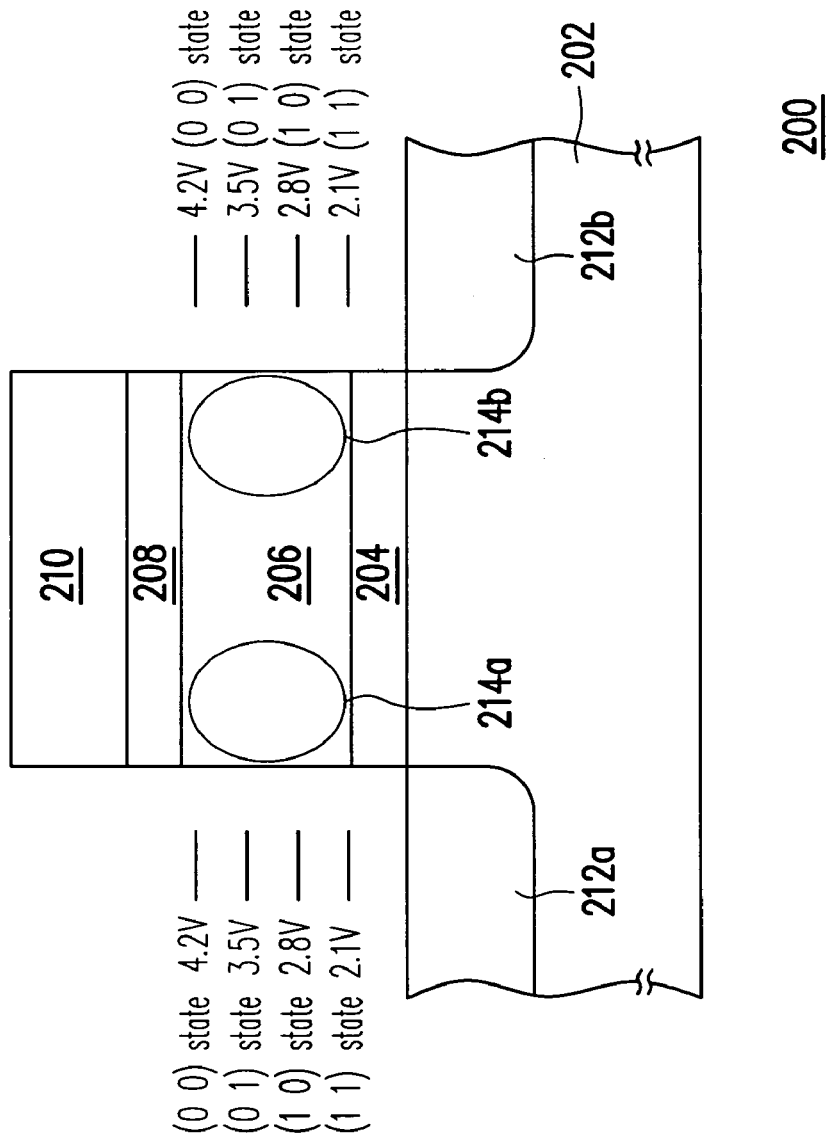
FIG. 2 is a cross sectional view of a silicon nitride read only memory according to a preferred embodiment of the present invention.

First, a memory cell with two storage positions is provided in the step 100 of FIG. 1. The memory cell can be, for example, the read only memory 200 with the silicon nitride layer in FIG. 2. The memory cell 200 comprises the substrate 202, the tunnel layer 204, the silicon nitride charge storage layer 206, the charge barrier layer 208 and the control gate layer 210, which are sequentially formed over the substrate 202. The memory cell 200 further comprises the doped regions 212a and 212b, which are disposed in the substrate 202 adjacent to two sides of the gate control layer 210.

Note that the silicon nitride charge storage layer 206 is a non-conductive material layer. By applying a voltage, electrons or holes are injected into two sides of the silicon nitride charge storage layer 206 so that the silicon nitride charge storage layer 206 provides two storage positions 214a and 214b for the purpose of data writing. In this embodiment, if each of the storage positions 214a and 214b stores 2 bits, the memory cell includes four, i.e., $2^2$, threshold voltage states, such as the first state (00), the second state (01), the third state (10) and the fourth state (11).

In this embodiment, the threshold voltage of the first state (00) is set as 4.2V, the threshold voltage of the second state (01) is set as 3.5V, the threshold voltage of the third state (10) is set as 2.8V and the threshold voltage of the fourth state (11) is set as 2.1V. Accordingly, the threshold voltages from the first state to the fourth state are gradually reduced, and the every difference between the threshold voltages of two neighboring states is 0.7V. In other embodiments, differences between the threshold voltages of every two neighboring states can be different. Additionally, in order to smoothly perform the read operation for the memory cell, the difference between the maximum and minimum threshold voltages should not be too small to maintain a better detecting window. In a preferred embodiment, the difference between the maximum and minimum threshold voltages should be at least larger than or equal to 2V to provide a better detecting window.

Figure 3:
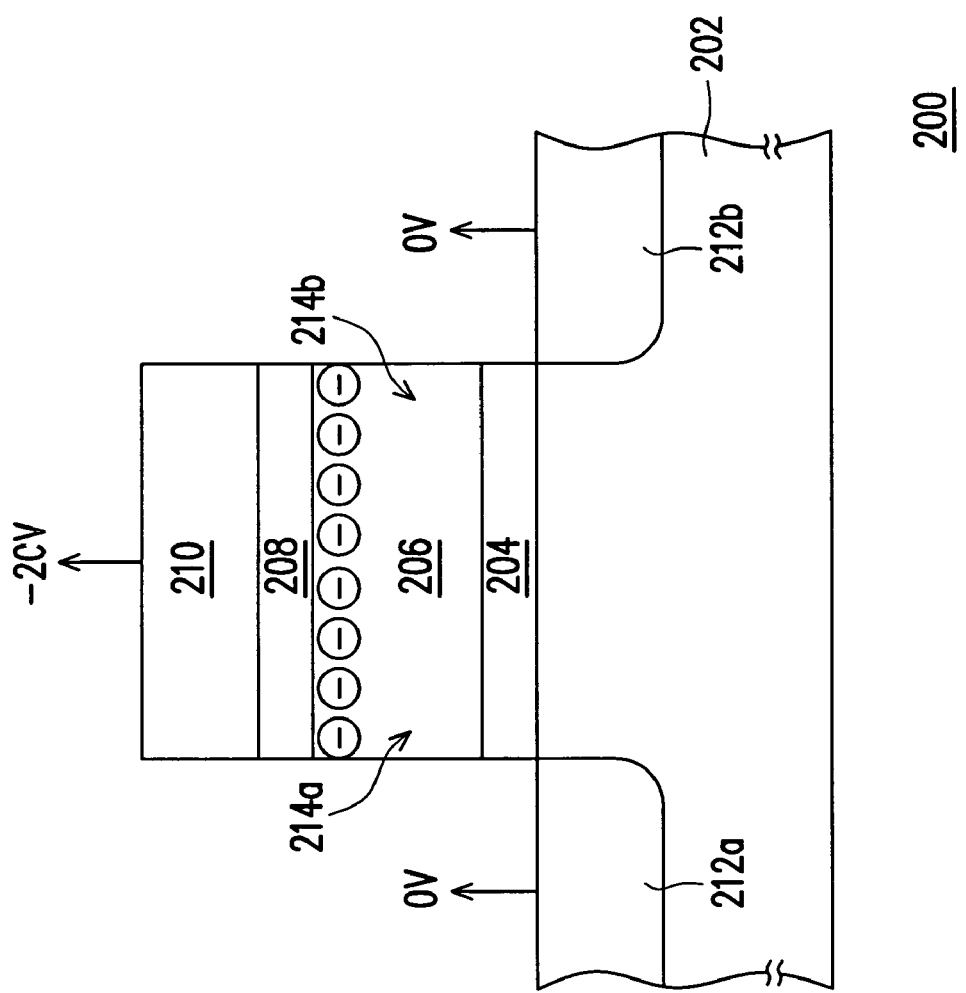
FIG. 3 is a cross sectional view showing the silicon nitride read only memory of FIG. 2 after a erasing step.

In step 102 of FIG. 1, the memory cell is erased to increase the threshold voltages of the two storage positions described above. In detail, electrons are injected into the charge storage layer 206 by the FN or –FN tunneling effect so that all memory cells of the memory device are at the high threshold voltage state as shown in FIG. 3. Moreover, the high threshold voltage state is larger than the threshold voltage of any one from the first state to the fourth state. In an embodiment of erasing the memory cell, –20V is applied to the control gate 210, and 0V is applied to the doped regions 212a and 212b. As a result, threshold voltages of all memory cells are enhanced to 7V.

In step 104 of FIG. 1, a judging step is performed to compare the first programming state and the second programming state, which are going to be programmed for the first storage position and the second storage position, respectively. Wherein, the first programming state and the second programming state are selected from the first state (00), the second state (01), the third state (10) and the fourth state (11). According to different programming states of the storage positions, the memory cell may include 16 different programming states.

In step 106 of FIG. 1, according to the comparison result, a proper programming step is selected. In this embodiment, there are 16 possible programming states. In order to obtain a desired detecting window, these 16 possible programming states are categorized. According to the categorization of the programming states, there are three possible programming steps 108a–108c shown in FIG. 1.

Figure 4A:
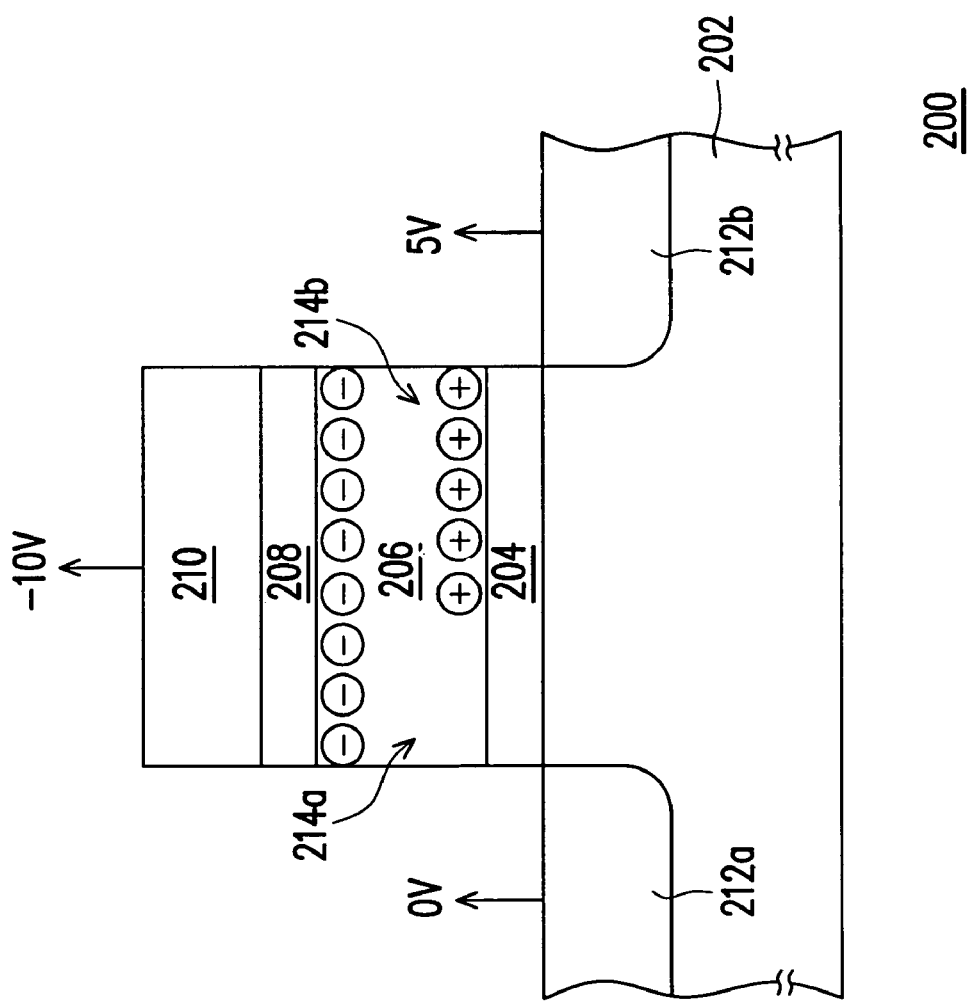
FIG. 4A is a cross sectional view showing the storage position 214a of the silicon nitride read only memory of FIG. 2 after the programming step.
Figure 4B:
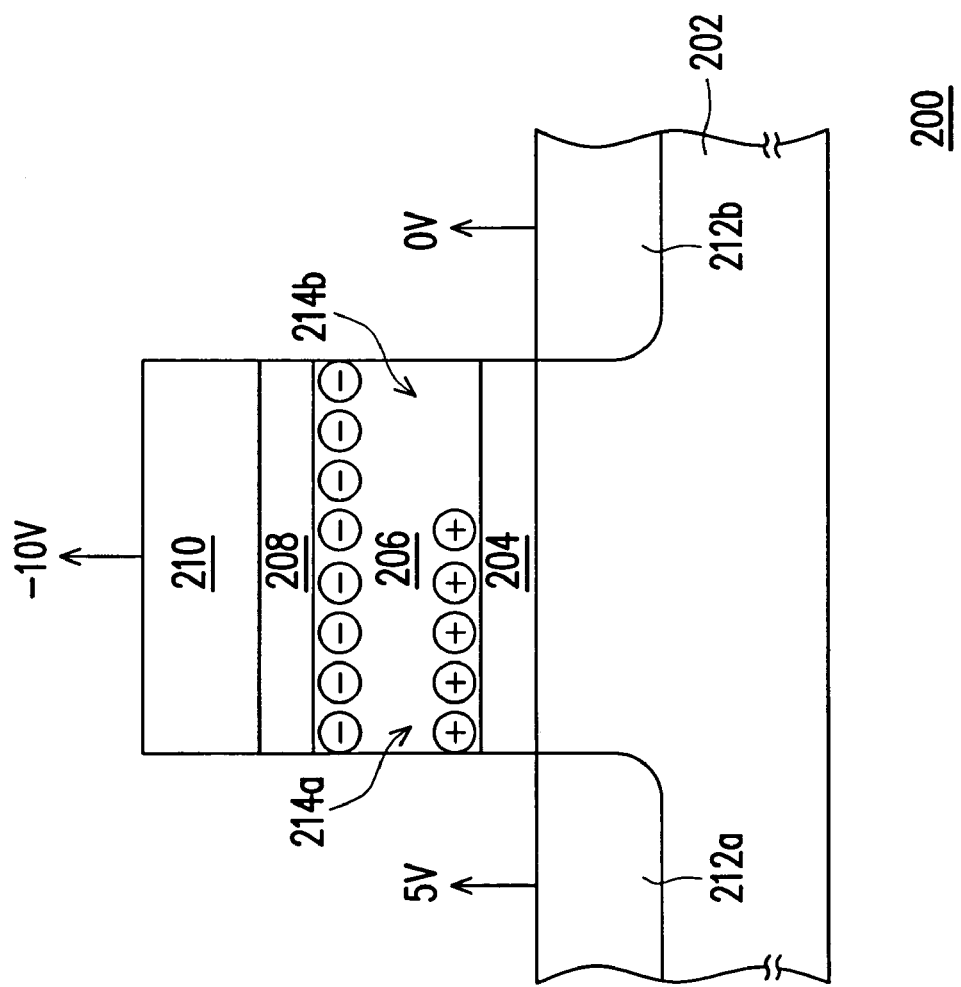
FIG. 4B is a cross sectional view showing the storage position 214b of the silicon nitride read only memory of FIG. 2 after the programming step.

Note that in the present invention these possible programming steps can be performed by the band-to-band hot hole effect to inject a proper amount of holes into the storage positions 214a and 214b. Wherein, the amount of the injected holes is determined by the programming time. The more the holes are injected, the more the threshold voltages of the storage positions 214a and 214b are lowered. In an embodiment of applying the band-to-band hot hole effect, –10V is applied to the control gate layer 210, 5V is applied to the doped regions 212b, 0V is applied to the doped region 212a, for example. As a result, holes are injected into the storage position 214b, which is adjacent to the doped region 212b as shown in FIG. 4A. In another embodiment of applying the band-to-band hot hole effect, –10V is applied to the control gate layer 210, 5V is applied to the doped regions 212a, and 0V is applied to the doped region 212b, for example. As a result, holes are injected into the storage position 214a, which is adjacent to the doped region 212a as shown in FIG. 4B.

Following are detailed descriptions of these programming steps.

Figure 5A:
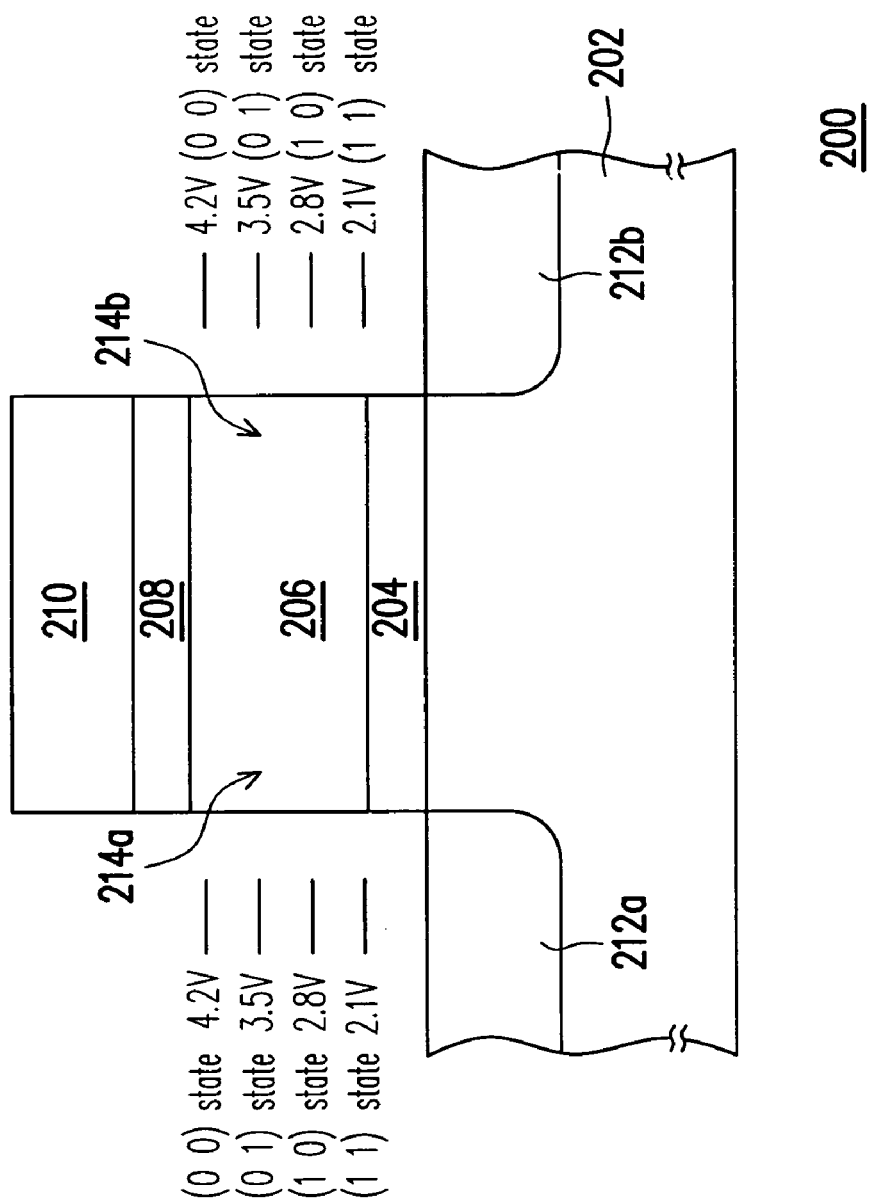
FIG. 5A is a drawing showing proper programming states which are adapted for a two-side programming step.

FIG. 5A is a drawing showing proper programming states which are adapted for a two-side programming step. Referring to FIG. 5A, the programming states which are going to be programmed for the storage positions 214a and 214b are the same. For example, both programming states which are going to be programmed for the storage positions 214a and 214b are one of the (00), (01), (10) and (11). Then, a two-side programming step is performed to the memory cell 200. According to the two-side programming step, one of the storage positions 214a and 214b is programmed with a time interval sequence (step 500). Another one of the storage positions 214a and 214b then is programmed with the same time interval sequence (step 502). Among these 16 possible programming states, the two-side programming step is adapted for four states.

Figure 5B:
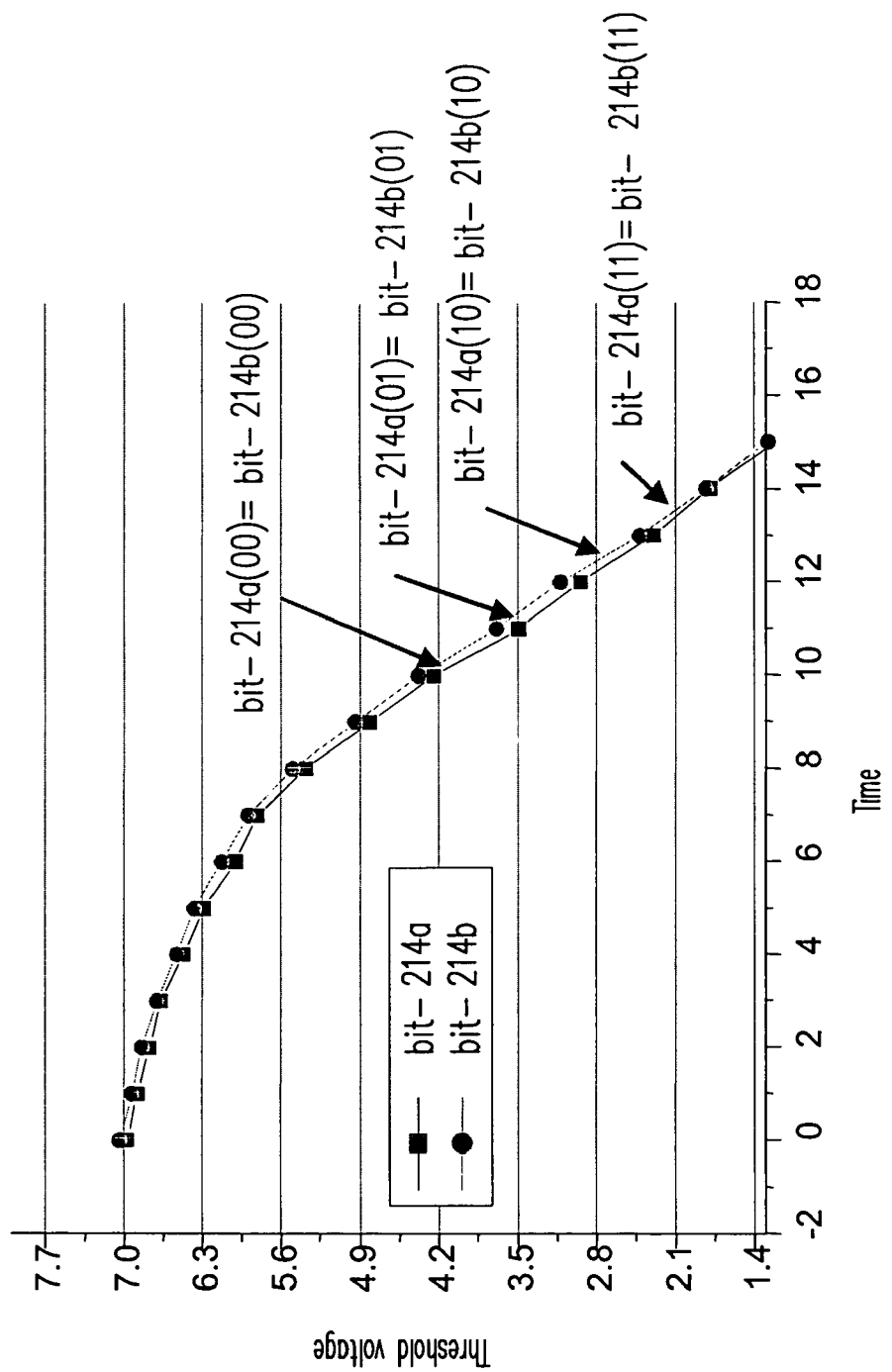
FIG. 5B is a drawing showing a relationship between the threshold voltage and the programming time during performing the two-side programming step.

Note that when one storage position (such as the storage position 214a) is programmed with holes, the threshold voltage of another storage position (such as the storage position 214b) is reduced with the threshold voltage of the being-programmed storage position by the interaction of the two storage positions as shown in FIG. 5B. Since the same state should be programmed for these two storage positions, the programming times must be the same so the reductions of the threshold voltages can be equal.

In the embodiment described above, the programming function can be achieved by performing steps 500 and 502 once. In another embodiment, the reductions of the threshold voltages 6f the storage positions 214a and 214b can be achieved by repeating steps 500 and 502 until the threshold voltages are gradually lowered to the threshold voltages corresponding to the desired programming states. After a cycle of the steps 500 and 502 is performed, a detecting step can be performed to determine whether the threshold voltages of the programmed storage position 214a and 214b are equal to the threshold voltages corresponding to the desired programming states. If not, steps 500 and 502 are repeated at least once until the threshold voltages of the programmed storage positions are equal to the threshold voltages corresponding to the desired programming states. Wherein, the detecting step is similar to a read step. Whether the programming state which is desired is reached is determined by the detected current.

Figure 6A:
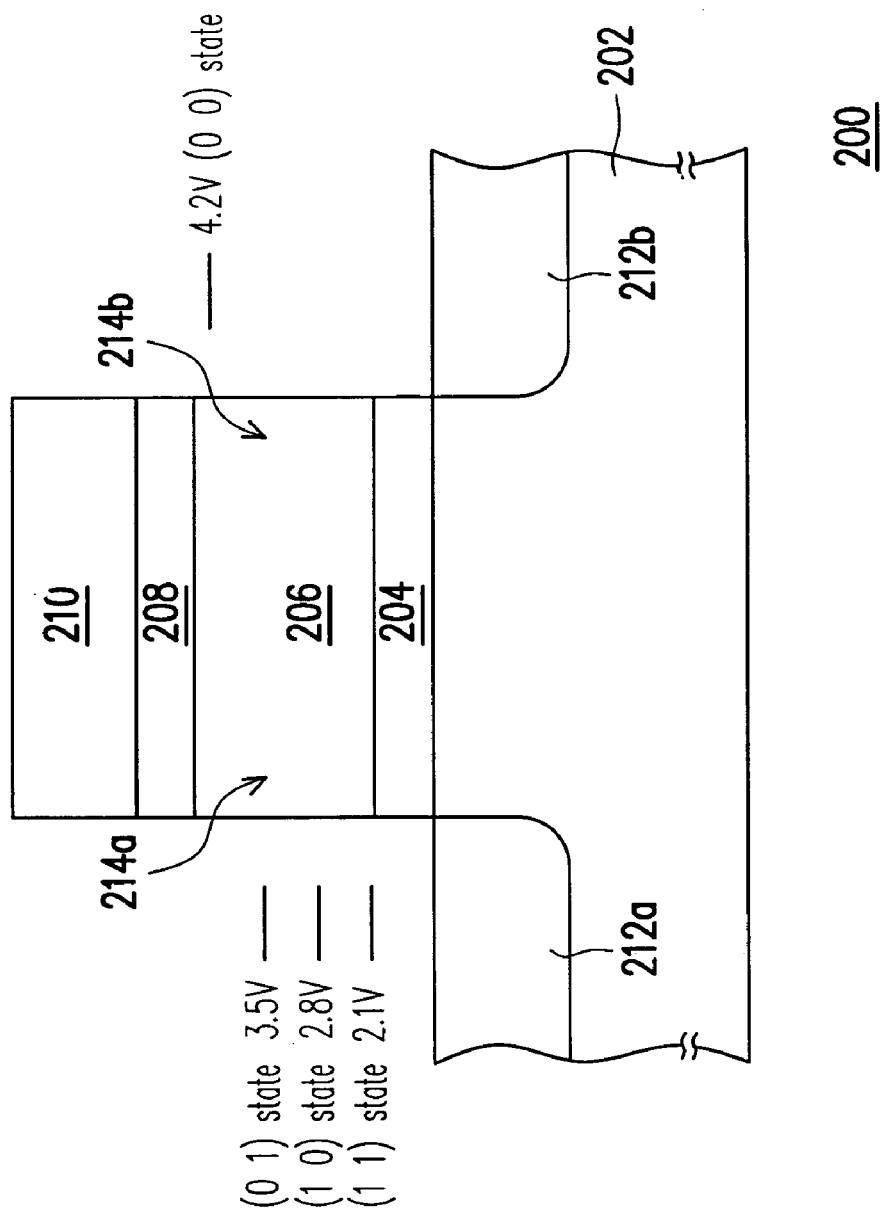
FIG. 6A is a drawing showing proper programming states which are adapted for a one-side programming step.

FIG. 6A is a drawing showing proper programming states which are adapted for a one-side programming step. Referring to FIG. 6A, when the programming state, which is going to be programmed for the storage position 214b is the first state (00), and the programming state, which is going to be programmed for the storage position 214a is other states, such as (01), (10) and (11) except the first state (00), a one-side programming step is performed to the memory cell 200. According to the one-side programming step, the storage position 214a is programmed until the threshold voltage of the storage position 214a is equal to the threshold voltage corresponding to the desired programming state (step 600). In another embodiment, the programming state, which is going to be programmed for the storage position 214a, can be the first state (00), and the programming state, which is going to be programmed for the storage position 214b, is other states, such as (01), (10) and (11) except the first state (00). Among these 16 possible programming states, the one-side programming step is adapted for 6 states.

Figure 6B:
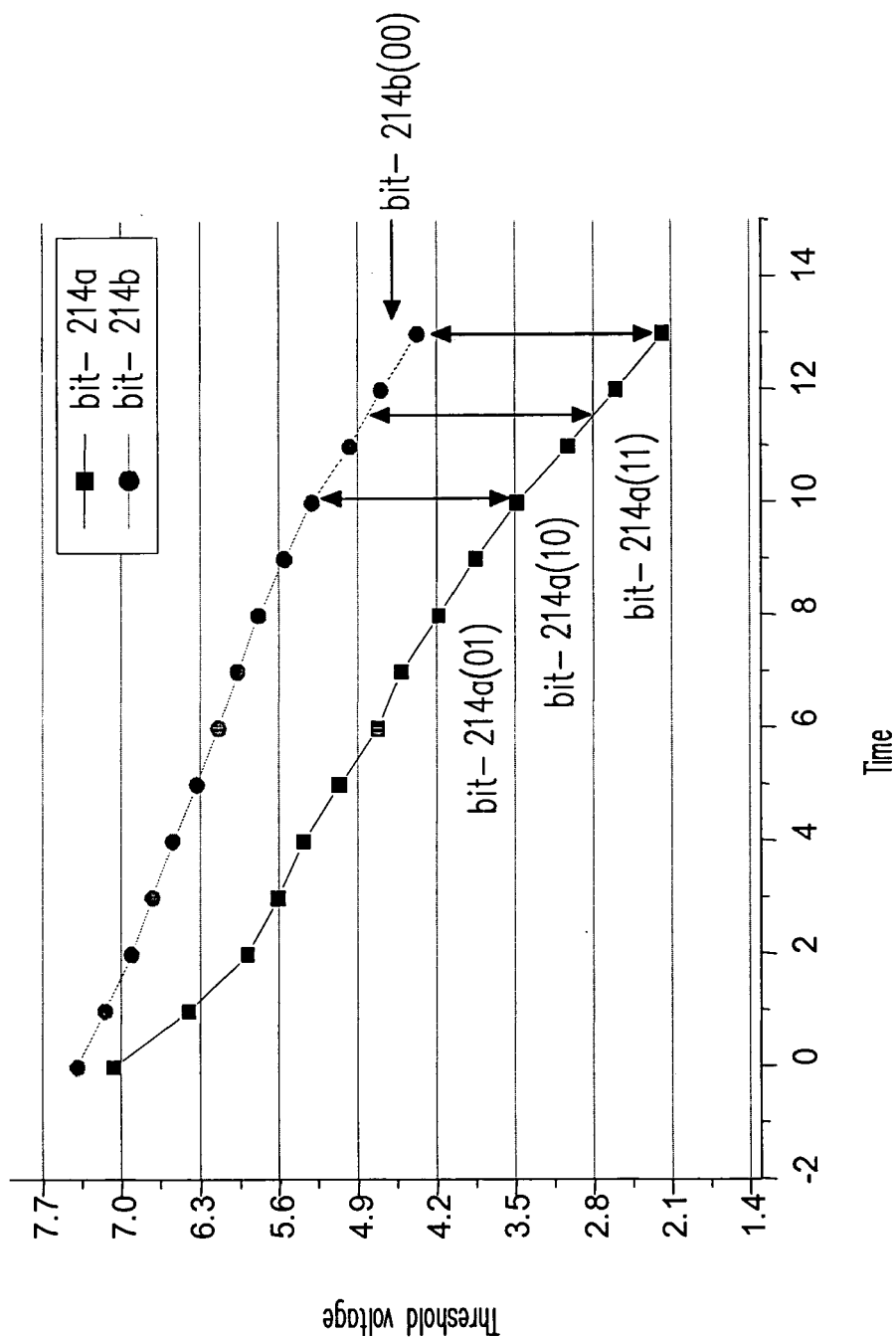
FIG. 6B is a drawing showing a relationship between the threshold voltage and the programming time during performing the one-side programming step.

Note that when the storage position 214*a* is programmed with holes, the threshold voltage of the storage position 214*b* is reduced with the threshold voltage of the being-programmed storage position by the interaction of the two storage positions as shown in FIG. 6B. Moreover, the reduction of the threshold voltage of the affected storage position 214*b* is smaller than that of the storage position 214*a*.

In the embodiment described above, the programming function can be achieved by performing step 600 once. In another embodiment, the reduction of the threshold voltage of the storage position 214*a* can be achieved by repeating step 600 until the threshold voltages are lowered to the threshold voltages corresponding to the desired programming states. After the step 600 is performed once, a detecting step can be performed to determine whether the threshold voltage of the programmed storage position 214*a* is equal to the threshold voltage corresponding to the desired programming state. If not, step 600 is repeated at least once until the threshold voltage of the programmed storage position 214*a* is equal to the threshold voltage corresponding to the desired programming state. Wherein, the detecting step is similar to a read step. Whether the programming state which is desired is reached is determined by the detected current.

Figure 7A:
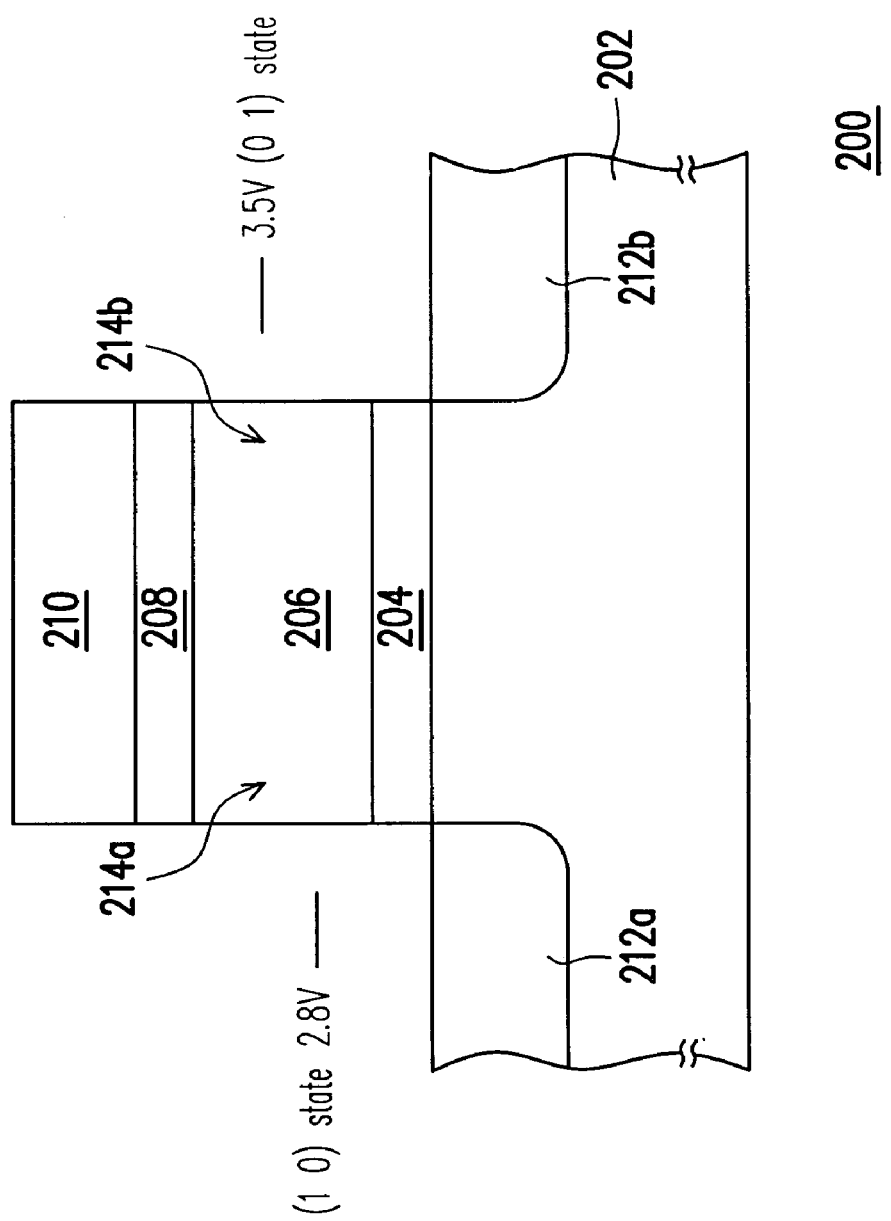
FIGS. 7A, 8A and 9A are drawings showing possible programming states which are adapted for the switched two-side programming step.
Figure 8A:
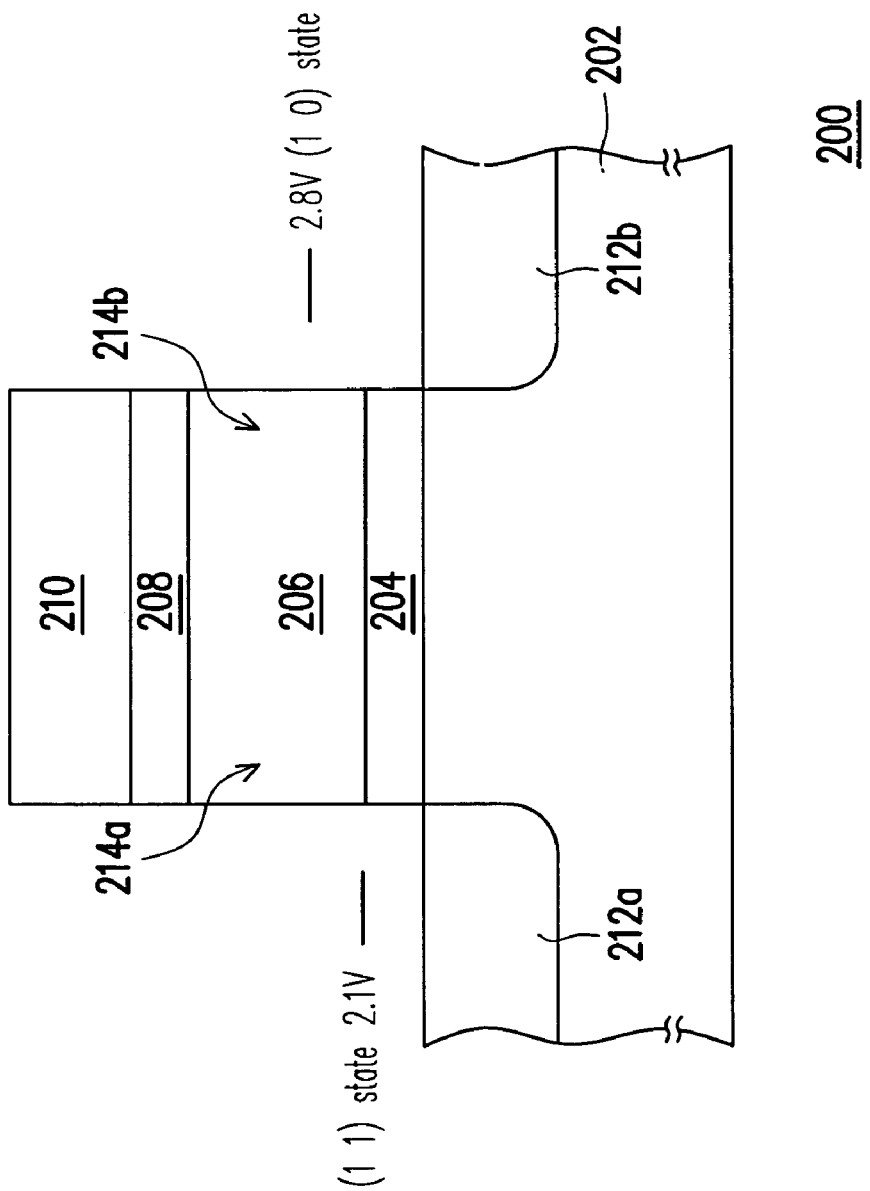
Figure 9A:
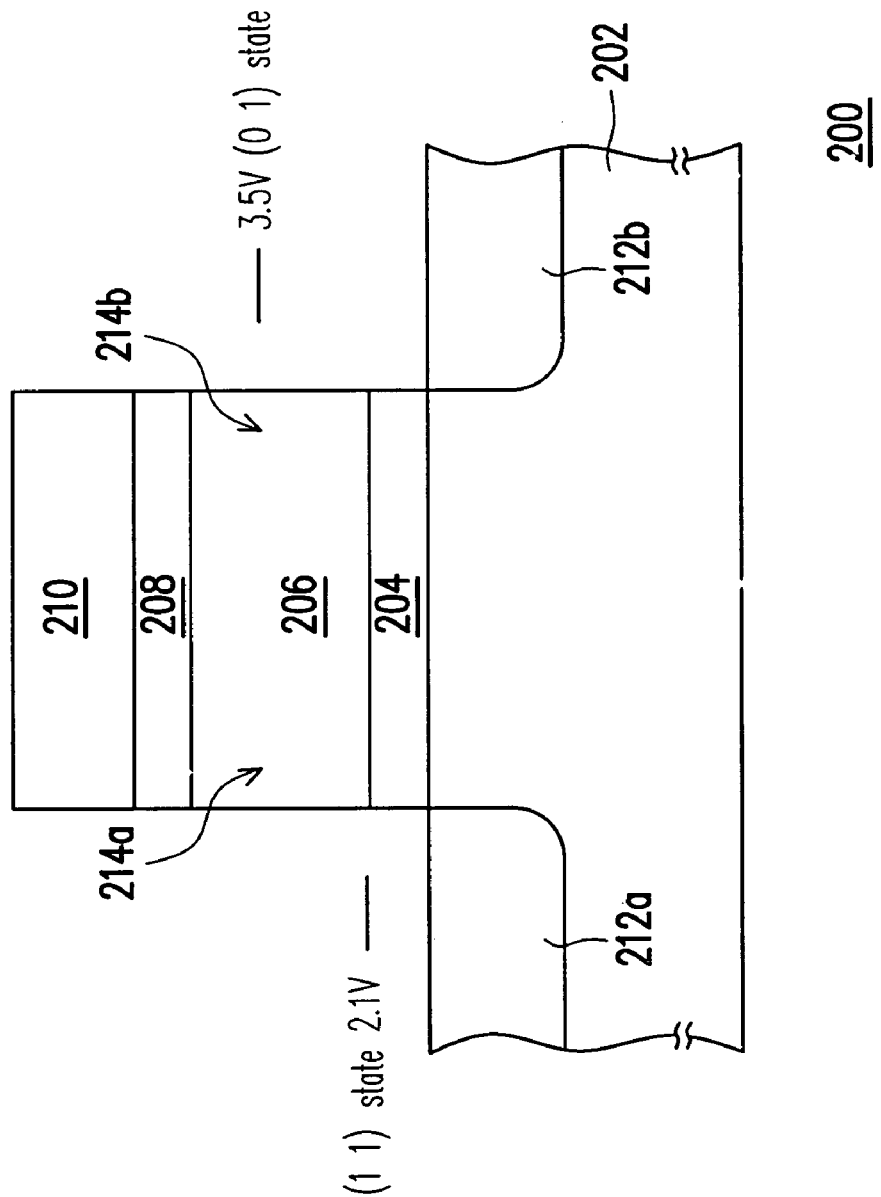

Referring to FIG. 7A, when the programming states, which are not going to be programmed for the storage positions 214*a* and 214*b*, are not the first state described above, and the threshold voltages of the states are different, a switched two-side programming step is performed to the memory cell. In the embodiment of FIG. 7A, the programming states, which are going to be programmed for the storage positions 214*a* and 214*b*, are (10) and (01). According to the switched two-side programming step, the threshold voltages corresponding to the programming states, which are going to be programmed, are compared (step 700). The programming state, which has a lower threshold voltage, is then selected; and the storage position (such as the storage position 214*a*) corresponding thereto is programmed until the difference between the threshold voltages of the storage positions 214*a* and 214*b* reaches a value (step 702). Then, another storage position (such as the storage position 214*b*) is programmed (step 704). In other embodiments, the programming states of the storage positions 214*a* and 214*b* can be, for example, (11) and (10) as shown in FIG. 8A, (11) and (01) as shown in FIG. 9A, or any combination constituted by (01), (10) and (11). Among these 16 possible programming states, other programming steps which are not suitable for the one-side programming step and the two-side programming step are adapted for the switched two-side programming step.

Figure 7B:
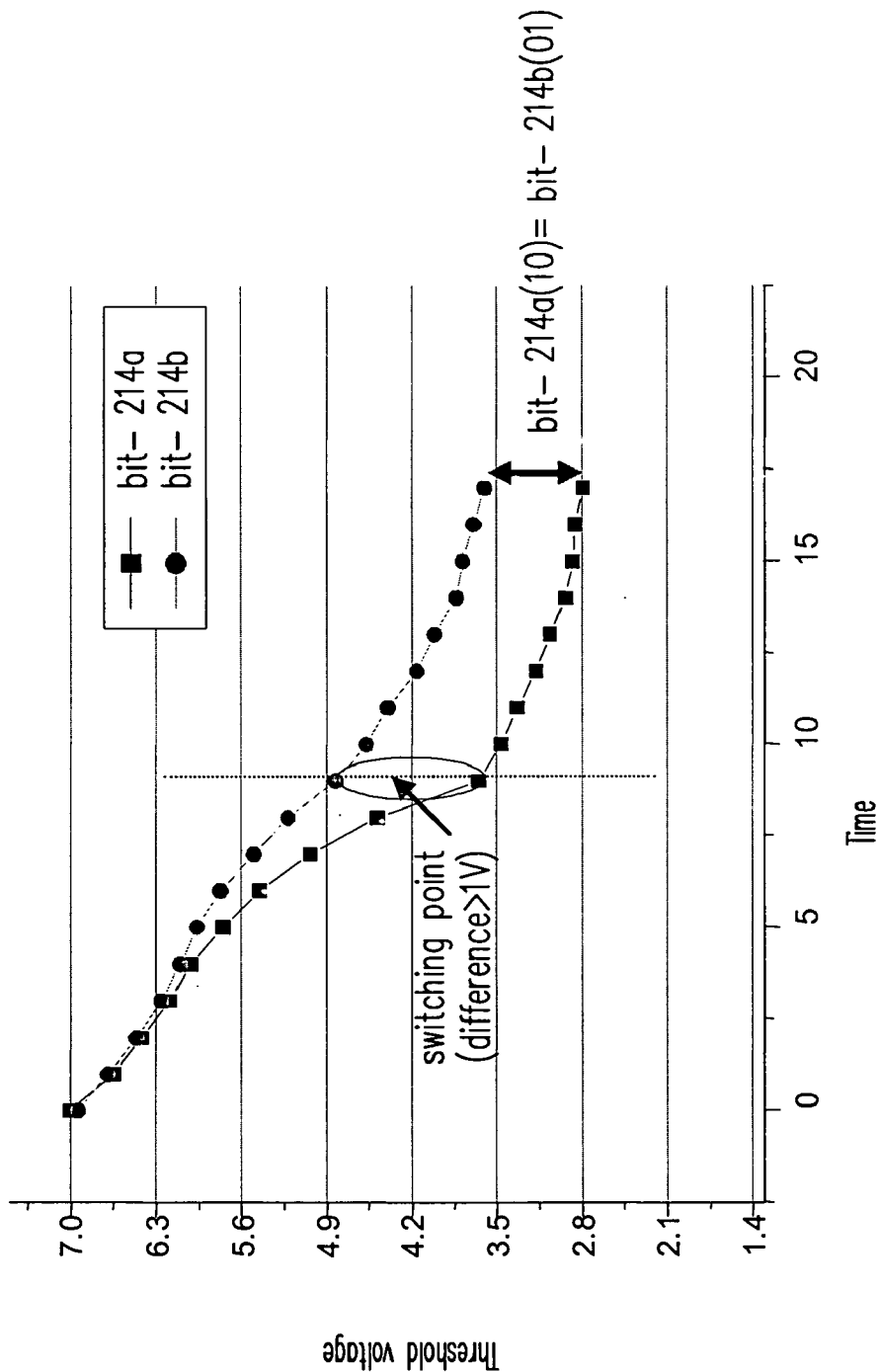
FIGS. 7B, 8B and 9B are drawings showing relationships between the threshold voltage and the programming time during performing the switched two-side programming step.
Figure 8B:
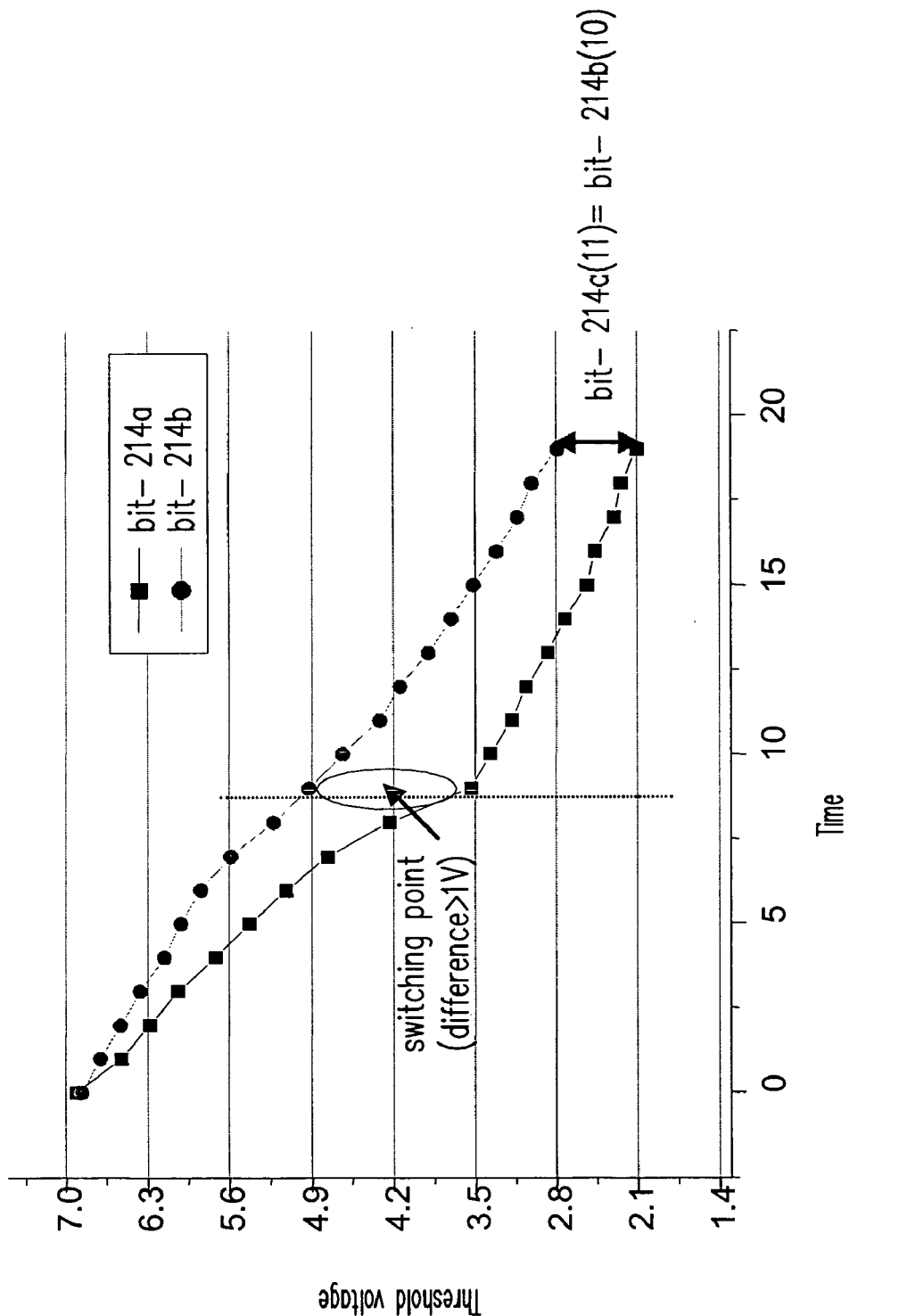
Figure 9B:
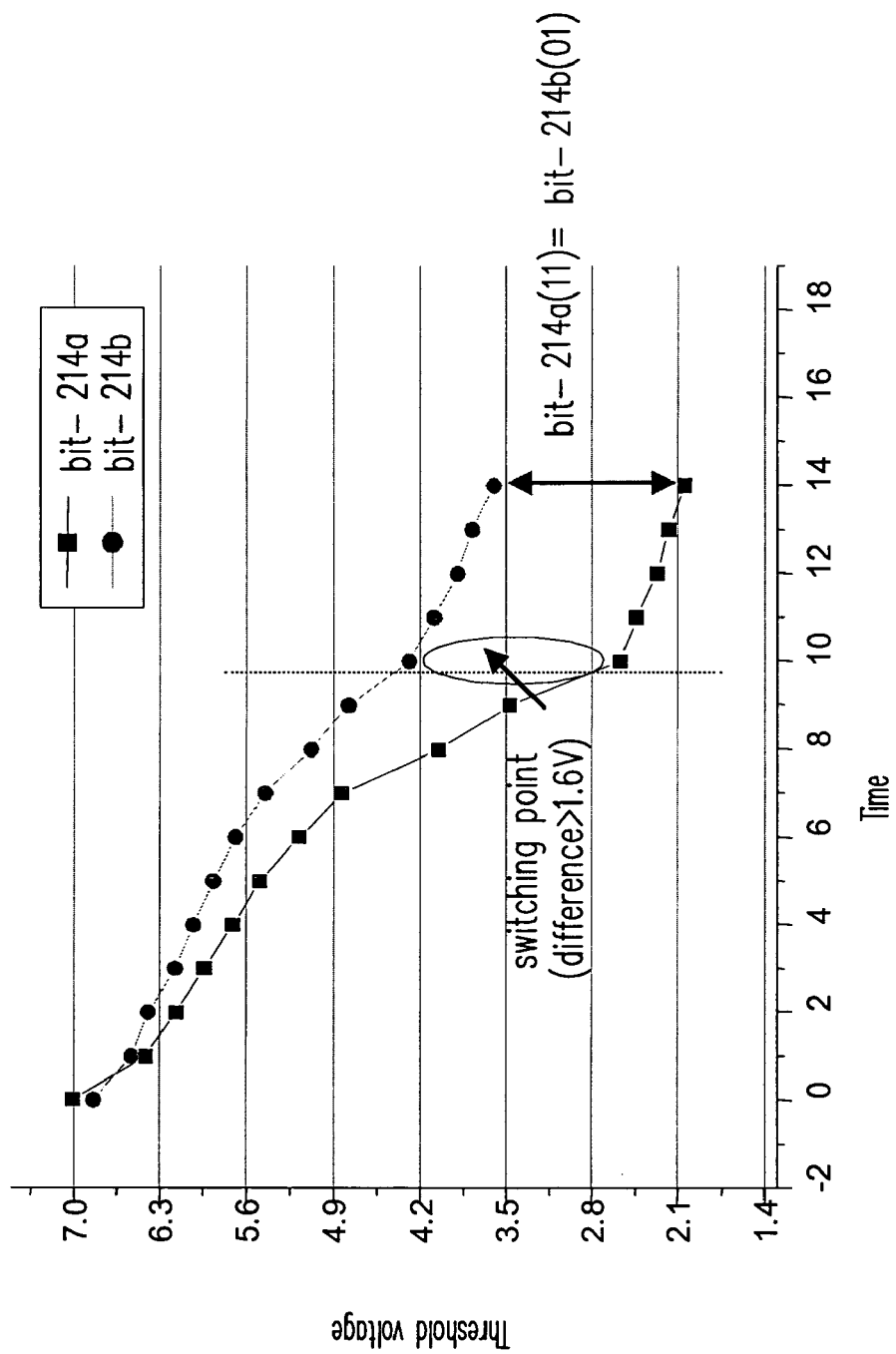

Note that when the storage position 214*a* is programmed with holes, the threshold voltage of the storage position 214*b* is reduced with the threshold voltage of the being-programmed storage position by the interaction of the two storage positions as shown in FIG. 7B, 8B or 9B. Moreover, the reduction of the threshold voltage of the affected storage position 214*b* is smaller than that of the storage position 214*a*.

In order for the selected programming cell to have a desired detecting window, the timing of switching from step 702 to step 704 should be properly selected. Referring to FIGS. 7B and 8B, if the difference of the threshold voltage of two neighboring states is a threshold voltage interval, such as 0.7V, and the difference of the threshold voltages of the programming states which are going to be programmed for the storage positions 214*a* and 214*b* is also 0.7V, the value in step 702 should be at least larger than 1V to obtain a better detecting window. Referring to FIG. 9B, if the difference of the threshold voltage of two neighboring states is a threshold voltage interval, such as 0.7V, and the difference of the threshold voltages of the programming states, which are going to be programmed for the storage positions 214*a* and 214*b*, is also 1.4V, the value in step 702 should be at least larger than 1.6V to obtain a better detecting window.

In the embodiment described above, the programming function can be achieved by performing step 702 once. In another embodiment, the reduction of the threshold voltage of the storage position 214*a* can be achieved by repeating step 702. As a result, the threshold voltages can be lowered to the threshold voltages corresponding to the desired programming states. After step 702 is performed once, a detecting step can be performed to determine whether the difference of the threshold voltages of the programmed storage positions 214*a* and 214*b* is equal to the value. If not, the step 702 is repeated at least once until the difference of the threshold voltages of the programmed storage positions 214*a* and 214*b* is equal to the value. Wherein, the detecting step is similar to a read step. Whether the programming state which is desired is reached is determined by the detected current.

Under the similar situation, in the embodiment described above, the programming function can be achieved by performing step 704 once. In another embodiment, the reduction of the threshold voltage of the storage position 214*b* can be achieved by repeating step 704. As a result, the threshold voltages can be lowered to the threshold voltages corresponding to the desired programming states. After the step 704 is performed once, a detecting step can be performed to determine whether the threshold voltage of the programmed storage position 214*b* is equal to the threshold voltage corresponding to the programming state which is going to be programmed. If not, step 704 is repeated at least once until the threshold voltage of the programmed storage position 214*b* is equal to the threshold voltage corresponding to the programming state which is going to be programmed. Wherein, the detecting step is similar to a read step. Whether the programming state which is desired is reached is determined by the detected current.

Accordingly, the present invention has the following advantages:

1. Before the memory cell of the present invention is programmed, the programming state that is going to be programmed will be determined first. Accordingly, a desired programming step is selected to write data, and the distributions of the threshold voltages of different levels are effectively controlled. The single memory cell thus serves as a multi-level cell.

2. By using the desired programming step to write the data, the memory cell has a better detecting window for the subsequent read operation of the memory cell.

3. According to the method of the present invention, the issue caused by the second bit can be effectively controlled and the failure of the subsequent read operation of the memory cell is reduced.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A method for programming a multi-level cell, comprising:
providing a memory cell, the memory cell comprising a first storage position and a second storage position, wherein each of the first storage position and the second storage position stores n bits, and $2^n$ states with different threshold voltages, and the threshold voltages of the states are gradually reduced from the first state to the $2^n$th state;
erasing the memory cell to raise and make threshold voltages of the first and second storage positions larger than the threshold voltages of the states; and
performing a judging step, comparing a first programming state and a second programming state, which are going to be programmed for the first storage position and the second storage position, respectively,
when the first programming state is as same as the second programming state, a two-side programming step being performed to the memory cell;
when one of the first programming state and the second programming state is the first state, and another is a state except the first state, a one-side programming step being performed to the memory cell; and
when the first programming state and the second programming state are not the first state, and the threshold voltages corresponding to the first programming state and the second programming state are different, a switched two-side programming step being performed to the memory cell.

2. The method for programming a multi-level cell of claim 1, wherein the two-side programming step comprises:
(a) programming one of the first storage position and the second storage position with a time interval sequence; and
(b) programming another of the first storage position and the second storage position with the time interval sequence.

3. The method for programming a multi-level cell of claim 2, after the step (b) further comprising:
(c) performing a testing step to check whether the threshold voltages of the first storage position and the second storage position are substantially equal to the threshold voltages corresponding to the first programming state and the second programming state, if not, the steps (a) and (b) being repeated at least once until the threshold voltages of the first storage position and the second storage position are substantially equal to the threshold voltages corresponding to the first programming state and the second programming state.

4. The method for programming a multi-level cell of claim 2, wherein the steps (a) and (b) are performed by a band-to-band hot hole effect.

5. The method for programming a multi-level cell of claim 1, wherein the one-side programming step comprises:
(a) programming one of the first storage position and the second storage position, wherein the programming state corresponding to the programmed storage position is not the first state.

6. The method for programming a multi-level cell of claim 5, after the step (a) further comprising:
(b) performing a testing step to check whether the threshold voltage of the programmed storage position is substantially equal to the threshold voltage corresponding to the programming state, if not, the step (a) being repeated at least once until the threshold voltage of the programmed storage position is substantially equal to the threshold voltage corresponding to the programming state.

7. The method for programming a multi-level cell of claim 5, wherein the step (a) is performed by a band-to-band hot hole effect.

8. The method for programming a multi-level cell of claim 1, wherein the switched two-side programming step comprises:
(a) comparing the threshold voltages of the first programming state and the second programming status;
(b) selecting one of the first programming state and the second programming state, which has a lower threshold voltage, and performing a first-programming to the storage position corresponding thereto until a difference of the threshold voltages of the first storage position and the second storage position reaches a value; and
(c) performing a second-programming to another storage position.

9. The method for programming a multi-level cell of claim 8, after the step (b) and before the step (c), further comprising:
(b1) performing a testing step to check whether the difference of the threshold voltages of the first storage position and the second storage position reaches the value, if not, the step (a) being repeated at least once until the difference of the threshold voltages of the first storage position and the second storage position reaches the value.

10. The method for programming a multi-level cell of claim 8, wherein a difference of threshold voltages of two neighboring states is a threshold-voltage interval, and when a difference of the first programming state and the second programming state is a threshold-voltage interval, the value in the step (b) is at least larger than 1V.

11. The method for programming a multi-level cell of claim 8, wherein a difference of threshold voltages of two neighboring states is a threshold-voltage interval, and when a difference of the first programming state and the second programming state is two threshold-voltage intervals, the value in the step (b) is at least larger than 1.6V.

12. The method for programming a multi-level cell of claim 8, after the step (c) further comprising:
(c1) performing a testing step to check whether the threshold voltage of the programmed storage position is substantially equal to the threshold voltage corresponding to the programming state, if not, the step (c) being repeated at least once until the threshold voltage of the programmed storage position is substantially equal to the threshold voltage corresponding to the programming state.

13. The method for programming a multi-level cell of claim 8, wherein the steps (b) and (c) are performed by a band-to-band hot hole effect.

14. The method for programming a multi-level cell of claim 1, wherein the erasing step is performed by an FN tunneling effect.

15. The method for programming a multi-level cell of claim 1, wherein a difference between the threshold voltages of the first state and the $2^n$th state is at least larger than or equal to 2V.

16. The method for programming a multi-level cell of claim 15, wherein the n is 2 and a difference between two neighboring states is 0.7V.

* * * * *